(12) United States Patent
Moritz

(10) Patent No.: US 10,729,024 B2
(45) Date of Patent: Jul. 28, 2020

(54) POWER ADAPTER PLATE

(71) Applicant: LLS Technologies, Inc., Somerset, NJ (US)

(72) Inventor: Thomas Moritz, Somerset, NJ (US)

(73) Assignee: LLS Technologies, Inc., Somerset, NJ (US)

( * ) Notice: Subject to any disclaimer, the term of this patent is extended or adjusted under 35 U.S.C. 154(b) by 0 days.

(21) Appl. No.: 16/053,527

(22) Filed: Aug. 2, 2018

(65) Prior Publication Data
US 2020/0045841 A1 Feb. 6, 2020

(51) Int. Cl.
*G08B 17/10* (2006.01)
*H05K 5/02* (2006.01)
*F21V 33/00* (2006.01)

(52) U.S. Cl.
CPC ....... *H05K 5/0204* (2013.01); *F21V 33/0076* (2013.01); *G08B 17/10* (2013.01); *H05K 5/0247* (2013.01)

(58) Field of Classification Search
CPC .............. H05K 5/0204; H05K 5/0247; F21V 33/0076; G08B 17/10
USPC ........................................................ 340/628
See application file for complete search history.

(56) References Cited

U.S. PATENT DOCUMENTS

| 5,939,994 A * | 8/1999 | Meier ................. G08B 17/113 340/628 |
| 6,583,720 B1 | 6/2003 | Quigley |
| 6,970,183 B1 | 11/2005 | Monroe |
| 7,026,948 B1 * | 4/2006 | Rutter .................... G08B 17/10 340/627 |
| 8,742,938 B2 | 6/2014 | Casey |
| 9,123,221 B2 | 9/2015 | Puskarich |
| 9,912,154 B2 * | 3/2018 | Fleisig .................... H01R 13/72 |
| 2003/0227389 A1 * | 12/2003 | McGreal ............. G08B 17/113 340/628 |
| 2008/0151056 A1 | 6/2008 | Ahamefula |
| 2010/0102957 A1 * | 4/2010 | Rutledge .............. G08B 19/005 340/539.14 |
| 2011/0076881 A1 * | 3/2011 | Fleisig ................... H01R 13/72 439/501 |
| 2011/0076882 A1 * | 3/2011 | Fleisig ................... H01R 13/72 439/501 |
| 2011/0174943 A1 * | 7/2011 | Smith ...................... H02G 3/20 248/220.21 |
| 2012/0073874 A1 * | 3/2012 | Phillips .................. H02G 3/123 174/542 |
| 2012/0171987 A1 * | 7/2012 | Newman .............. G08B 29/181 455/404.1 |
| 2013/0039055 A1 | 2/2013 | Wilson et al. |
| 2014/0195826 A1 * | 7/2014 | Wojcik .................... G06F 21/86 713/300 |

(Continued)

FOREIGN PATENT DOCUMENTS

WO   2006026025 A2   3/2006

OTHER PUBLICATIONS

UCF Modular Home Monitoring System (2015) downloaded from http://www.eecs.ucf.edu/seniordesign/su2015fa2015/g07/Senior%20Design%202%20Document%20FINAL.pdf.

*Primary Examiner* — Naomi J Small
(74) *Attorney, Agent, or Firm* — Fox Rothschild LLP

(57) ABSTRACT

The invention relates to an AC power adapter plate capable of being mounted to a wall, ceiling, or power receptacle which comprises ports for connecting and providing DC power to peripheral devices and accessories.

20 Claims, 9 Drawing Sheets

(56) References Cited

U.S. PATENT DOCUMENTS

| | | |
|---|---|---|
| 2015/0077240 A1 | 3/2015 | Eck |
| 2015/0187194 A1 | 7/2015 | Hypolite et al. |
| 2016/0191268 A1 | 6/2016 | Diebel |
| 2016/0195856 A1 | 7/2016 | Spero |
| 2016/0214051 A1* | 7/2016 | Dicke .................. B01D 46/448 |
| 2016/0226207 A1* | 8/2016 | Fullerton ............... H01R 33/22 |
| 2017/0093105 A1* | 3/2017 | Belinksky .......... G06Q 10/0631 |

* cited by examiner

POWER ADAPTER PLATE

BACKGROUND

There is increasing demand for modern homes, offices, and other interior spaces to have electronic interconnectivity and capabilities. There is also increasingly available electronic accessories for the home, office, and workspace, from security cameras to climate control devices to music speakers to microphones. However, it is generally aesthetically undesirable and costly to install new receptacles in walls and ceilings for each new device one wishes to install. Furthermore, seamlessly integrating peripheral devices in the home is challenging due to alternating current (AC) requirements, requiring line cords, etc. Since interior areas and facilities, such as houses, offices, garages, and the like, are initially wired with various AC receptacles, which are commonly equipped with fixtures such as smoke and carbon monoxide detectors, lights, fans, security cameras, and other devices, there exists a need to have an AC/DC power adapter that integrates seamlessly with pre-installed AC receptacles and fixtures. It is with these desires, among others, that aspects of the present invention were conceived.

The present invention relates to an AC power adapter plate capable of being mounted to a wall, ceiling, or power receptacle which comprises ports for connecting and providing DC power to peripheral devices and accessories. The adapter plate may be mounted on any surface or receptacle with an AC power connection and may be mounted between another fixture and a wall or ceiling surface. For example, the adapter plate may be mounted behind and serve as a physical mount for smoke and carbon monoxide detectors or light fixtures. The adapter plate provides DC power for electronic peripherals, which may be removably attached directly or indirectly to the adapter plate at a variety of connection ports, which are accessible whether or not another fixture is mounted to the adapter plate. The peripheral devices may be connected directly to the adapter plate or mounted nearby and connected via a power wire to the adapter plate. The adapter plate may have various types of connectivity ports commonly used by peripheral devices, and may be powered at various common levels, such as 5V DC, 12V DC, or 110V AC power. The adapter plate is preferably rotatable on its receptacle or independently within its own housing so as to assist in the positioning of peripheral devices. The adaptor plate may optionally incorporate internal sensors, such as for temperature, humidity, audible signals, or smoke or gas. The adapter plate also may provide for remote operation of peripheral electronic devices, which allows for seamless integration into the home via AC availability at smoke detector locations or other AC receptacles. The adapter plate may also have integrated or modular capabilities to receive or send information with other devices or to a computer or cellular device via various wireless data transmission signals, such as WiFi, Bluetooth, or cellular signals.

BRIEF DESCRIPTION OF THE DRAWINGS

The objects, features, and advantages of the present disclosure set forth herein will be apparent from the following description of particular embodiments of those inventive concepts, as illustrated in the accompanying drawings. Also, in the drawings the like reference characters refer to the same parts throughout the different views. The drawings depict only typical embodiments of the present disclosure and, therefore, are not to be considered limiting in scope.

DETAILED DESCRIPTION

Figure 1A:
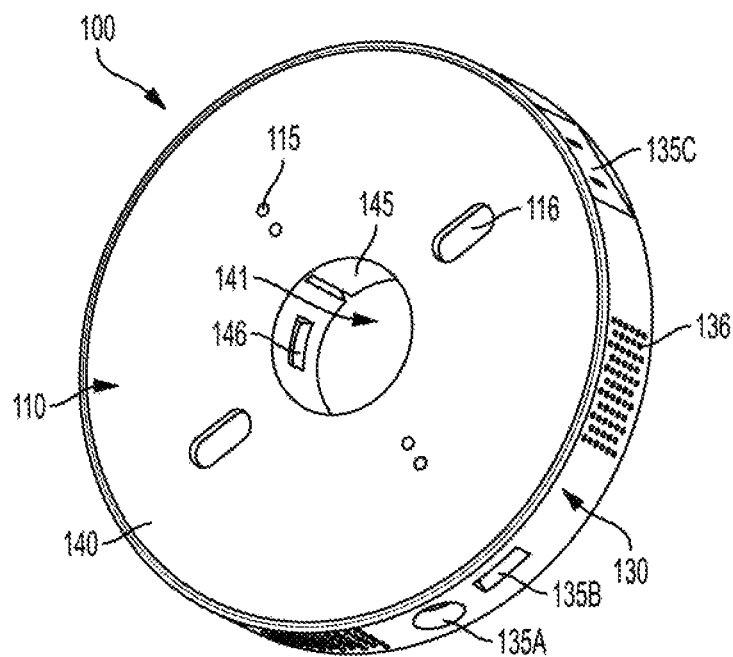
FIG. 1A is front view of an embodiment of an adapter plate of the present invention.

A power adapter plate of the present invention is capable of being mounted to a wall, ceiling, or power receptacle. The power adapter plate may be mounted on any surface or receptacle with an AC power connection and may be mounted between another fixture and a wall or ceiling surface. For example, the adapter plate may be mounted behind smoke and carbon monoxide detectors, light fixtures, fans, exit signs, emergency lighting, etc. In such a configuration, the adaptor plate serves as a physical mount for such fixtures. However, the adapter plate may be mounted independently of other fixtures without alteration of its function.

An adapter plate 100 of the present invention comprises a housing having a back surface 120, front surface 110, and one or more side surfaces 130, depending on the overall shape. The back surface 120 is configured to be mounted upon and face a wall, ceiling, or other mounting surface 900. The back surface 120 thus comprises one or more apertures 125 for mounting upon a mounting surface or receptacle. The front surface 110 is configured to be external facing and optionally to serve as a mounting plate for other fixtures, such as smoke detectors or light fixtures. The side surface 130 of the adapter plate comprises one or more connection ports for peripheral accessories to connect to. The interior of the connector plate is defined by the front 110, back 120, and side 130 surfaces and provides a housing for electronic components and circuitry, which may optionally include integrated functional electrical components, as described further herein.

The adapter plate 100 may be a variety of shapes and dimensions. In preferred embodiments, the adapter plate is sized similarly to a traditional smoke or carbon monoxide detector. In alternative embodiments, the adapter plate is sized similarly to the mounting plate of a light fixture. In preferred embodiments the adapter plate is round, however the adapter plate may be any shape that provides for the functionality described herein. In certain embodiments the adapter plate is a solid housing that connects on the back side to a wall/ceiling and an available AC power connection and on the front side provides a surface for mounting other fixtures with either direct or indirect access to the underlying AC power supply. In certain embodiments, the center of the adapter plate comprises an opening through which available AC power wires may pass. In such embodiments, the adapter plate preferably has means for connecting to the AC supply while optionally allowing additional wires to pass through the center opening of the adapter plate in order to connect to other fixtures. In said embodiments, the adapter plate may optionally comprise a removable cover for the central opening so that it may be covered when another fixture is not to be mounted on the adapter plate. In an alternative embodiment, the adaptor plate may be powered by a battery (DC) power supply, either independently of any household AC supply or as a backup power source in the event of an AC power outage.

In preferred embodiments, the central opening 141 of the adapter plate 100 is circular in shape. In such embodiments, it is preferable that the adapter plate housing be configured such that it is rotational about the central opening 141, which aids in the positioning of peripheral accessories. It is thus preferable to have a round adapter plate housing unit, so that the shape is uniform as it is rotated about the central opening. Regardless of the exterior shape, the central opening 141 is preferably round to enable rotation about the central opening. In certain embodiments, the adapter plate 100 is capable of rotating from approximately 45 degrees to approximately 315 degrees. In preferred embodiments, the adapter plate is capable of rotating from approximately 90 degrees to approximately 180 degrees. In preferred embodiments, the back surface 120 of the adapter plate is located on a baseplate 150, which is separate from, but interconnected with, a faceplate 140, upon which the front surface 110 of the adapter plate 100 is located, wherein the baseplate 150 and faceplate 140 share a common central opening 141. In this manner, the baseplate 150 may be fixed and in a static position on the mounting surface 900, while the faceplate 140 is able to rotate about the baseplate 150. In a preferred embodiment, the adapter plate comprises a physical stop post 230 that prevents rotation beyond a predetermined range of rotation.

The adapter plate 100 provides DC power for electronic peripherals, which may be removably attached directly or indirectly to the adapter plate at a variety of connection ports 135. In preferred embodiments, the connection ports 135 are located on the side(s) 130 of the adapter plate so as to be accessible whether or not another fixture is mounted to the front 110 of the adapter plate. In preferred embodiments, the adapter plate has at least two connection ports 135. The number of connection ports is limited solely by the size and configuration of the ports relative to the surface area of the side(s) of the adapter plate as well as the capacity of the interior of the housing of the adapter plate to house electronic circuits. The peripheral devices may be connected directly to the adapter plate or mounted nearby and connected via a power wire to the adapter plate. The adapter plate may have various types of connectivity ports commonly used by peripheral devices, and may be powered at various common levels, such as 5V or 12V DC power. Such power supplies may power a variety of electronic accessories, including but not limited to cameras, speakers, microphones, lights, motion sensors, temperature sensors, doorbells, and other peripheral devices. In certain embodiments, the adapter plate may further comprise AC power connectivity ports, such as 110V AC for connection of standard household electronic devices.

The adaptor plate may optionally incorporate internal devices or sensors, such as for temperature, humidity, audible signals, or smoke or gas. In a preferred embodiment, the adaptor plate comprises one or more sensors capable of detecting a triggered alarm state from an independent alarm within the same interior space, such as a smoke alarm or intruder alarm. In certain embodiments, the detection of the triggered alarm may be via third wire electrical pickup (i.e., connection to a hard-wired alarm system). In certain embodiments, the detection of the triggered alarm may be via a microphone integral to or connected to the adaptor plate. In a preferred embodiment, the adaptor plate comprises a wireless interface to a computer or cellular phone and is capable of sending alerts to a user (homeowner, manager, landlord, etc.) when an alarm state is detected. In a further preferred embodiment, upon detecting an alarm, the adapter plate automatically alerts a user of the alarm state and provides captured images or video to the user. This may be accomplished in several ways. In one embodiment, the adapter plate may automatically activate an integrated or peripheral camera to capture images or video (e.g., via an IFTTT applet). In an alternative embodiment, the adapter plate notifies a user of an alarm state, then the user is able to activate an attached camera via remote connection (e.g., an app on a mobile device) to surveil the situation. In an alternative embodiment, the adapter plate comprises one or more lights that illuminate or flash to indicate that an alarm state has been detected, and thereby the adapter plate is capable of providing a visual alarm to persons in the area of the adapter plate.

The adapter plate also may provide for remote operation of peripheral electronic devices, which allows for seamless integration into the home via AC availability at smoke detector locations or other AC receptacles. In such embodiments, the adapter plate may have integrated or modular capabilities to receive or send information with other devices or to a computer or cellular device via various wireless data transmission signals, such as WiFi, Bluetooth, cellular signals, local area network, or any IP-based telecommunications network. In this regard, the adapter plate is capable of sending signals to any connected (wired or wireless) peripheral accessories to send commands to and control the functionality of such accessories. When the adapter plate is in wired or wireless communication with such accessories, the adapter plate preferably is able to send status reports and communicate alarm states to a user via wireless or cellular communication. In an alternative, but not exclusive, embodiment, the wireless interface permits wireless control by the user of the one or more connectivity ports (e.g., DC outputs). Such wireless control may be, for example, on/off control of the power to the connectivity port. Such an embodiment provides capability to power on or power off an accessory, such as in the event the accessory needs to be reset, or to conserve power when the accessory is not in use.

FIG. 1A is front view of an embodiment of an adapter plate 100 of the present invention, having apertures 115 in front surface 110 to provide connection points for other fixtures, such as a smoke detector, carbon monoxide detector, light, exit sign, etc. Front surface 110 additionally has access channels 116 to permit the pass through of fasteners for mounting baseplate 150 to a surface 900. The faceplate 140 has a central opening 141 to permit the pass through of underlying AC power supply wires (not shown). The interior sidewall 145 of the faceplate 140 lines the central opening 141 and provides an AC power supply connection port 146 for connection to the AC power supply, such as via a wiring harness (not shown). The exterior sidewall 130 of the adapter plate contains power connection ports 135A, 135B, and 135C of various sizes for alternative types of powered accessories. For example, accessories may be connected and powered via a 12V DC plug connection as depicted by 135A, a USB connection as depicted by 135B, or a 110V AC plug connection as depicted by 135C. The sidewall(s) 130 of the faceplate also contain ventilation holes 136 to facilitate cooling of the internal electronic components.

Figure 1B:
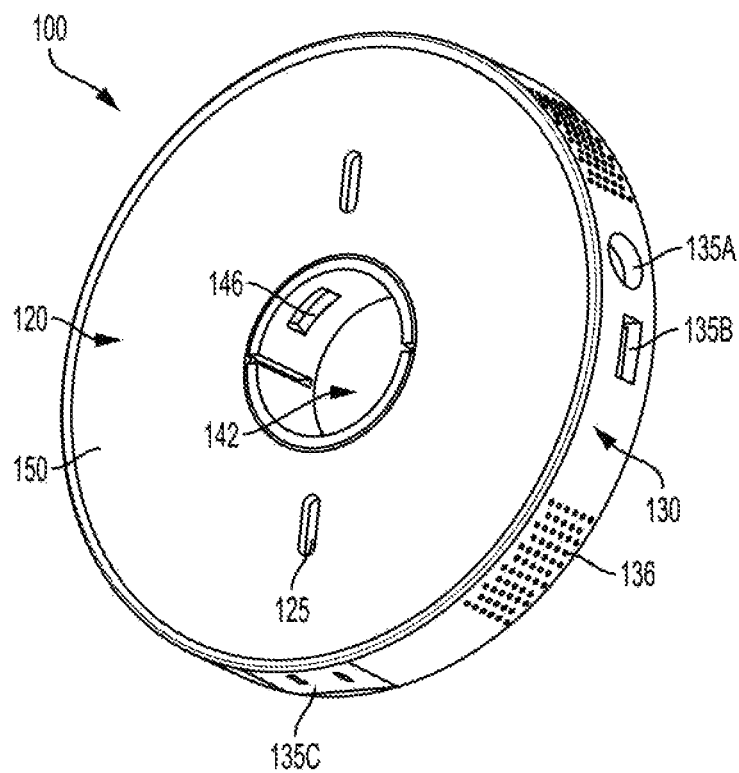
FIG. 1B is a rear view of an embodiment of an adapter plate of the present invention.

FIG. 1B is a rear view of an embodiment of an adapter plate 100 of the present invention, having apertures 125 in the back surface 120 of the baseplate 150 for mounting to a surface 900, such as a wall or ceiling. The baseplate has a central opening 142 concentric with the central opening 141 of the faceplate 140 to permit the pass through of underlying AC power supply wires (not shown). Additionally, the round and concentric central openings in the baseplate and faceplate permit the two to be rotational about each other, such that when baseplate 150 is mounted to a surface 900 the faceplate 140 may rotate about the central opening. In this manner, the baseplate 150 is fixed to the mounting surface 900 and the faceplate 140, together with its housed electronics and output connection ports 135, is capable of rotating about the baseplate 150.

Figure 1C:
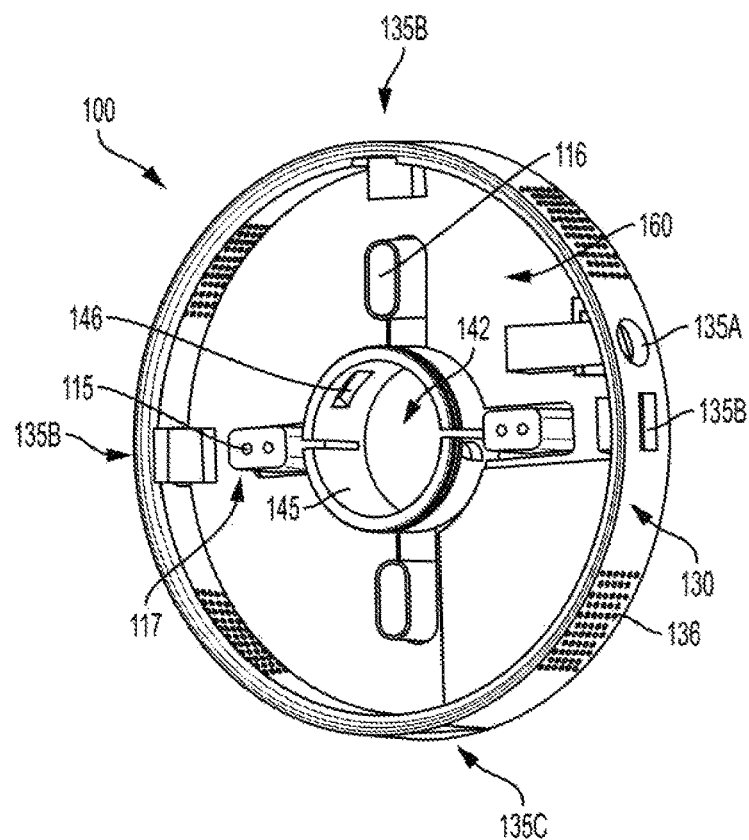
FIG. 1C is a rear view of the interior of an adapter plate of the present invention (with internal electronics omitted).

FIG. 1C is a rear view of the face plate 140 showing the interior housing 160 of an adapter plate 100 of the present invention. The interior housing 160 provides space within which the electronics of the adapter plate are contained. The interior view of connection ports 135 are also shown, which permit access to the internal electronics and DC adapters or AC pass through wiring. Standoff 117 comprises apertures 115 for receiving fasteners to mount an AC device or fixture on the front surface 110 of the faceplate 140. The standoffs 117 provide support for fasteners such as mounting screws.

Figure 1D:
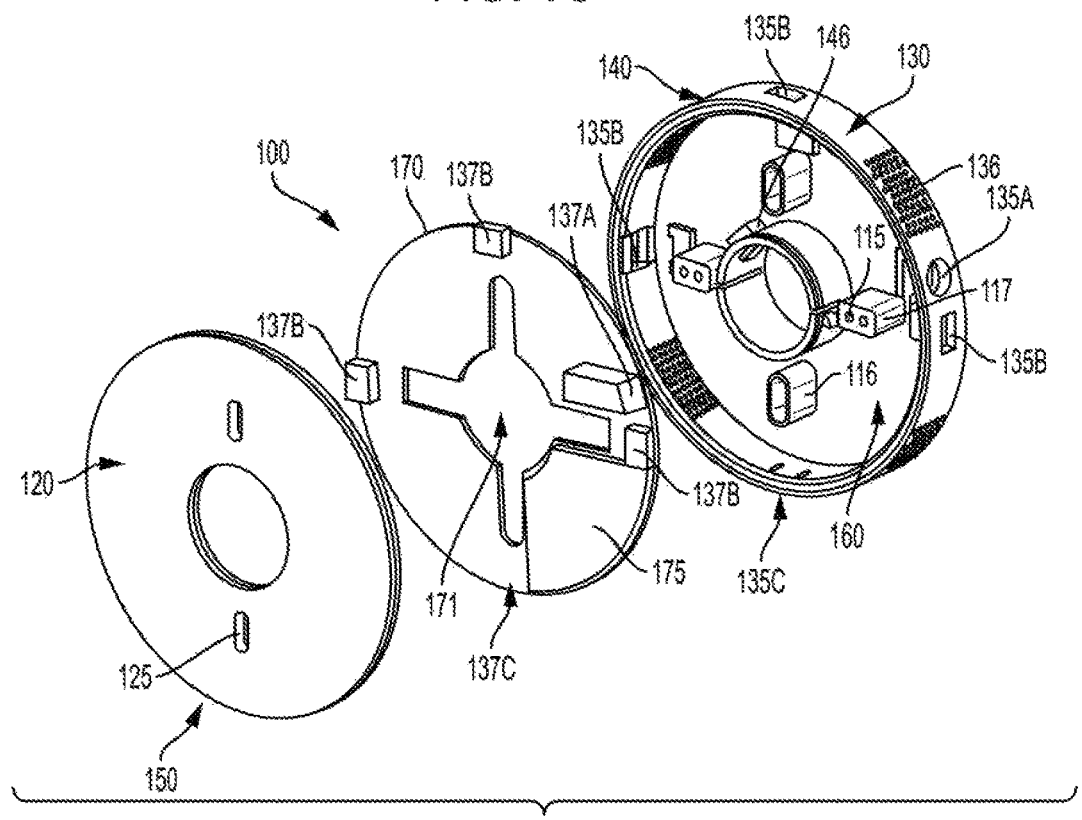
FIG. 1D is a rear exploded view of an adapter plate of the present invention.

FIG. 1D is a rear exploded view of an adapter plate 100 of the present invention. Interior housing 160 includes a printed circuit board 170, which, in addition to providing the electronic functionality of the device, provides power output connections 137, which are accessible through connection ports 135. The embodiment in FIG. 1C comprises one 12V DC conventional output connection 137A, three 5V DC USB output connections 137B, and an AC connection pass-through space 137C corresponding to a 110V AC receptacle style output connection port 135C. Circuit board 170 additionally has central opening 171, which is shaped to permit pass through of access channels 116 and standoffs 117. In a preferred embodiment, circuit board 170 additionally comprises wireless communications circuits 175. Interior housing 160 includes various circuitry to enable the adapter plate 100 to obtain an alarm signal from a detection device and activate a peripheral device that may trigger an alarm, or activate a processing unit 304 on the circuit board 170 to send a notification to a user. In particular, the adapter plate 100 includes a processing unit 304 and wireless communication circuits 175 including an interface that function together to generate an output (e.g., a binary output signal) indicative of the presence of an emergency (e.g., the presence of smoke) for transmission to a remote computing device, such as the server computing device 702 or the communication devices ($722_1$, $722_2$, . . . , $722_n$). The baseplate 150 provides a fixed mechanical interface with a mounting surface 900, and is mountable through apertures 125. When mounted, back surface 120 will face the mounting surface 900. When assembled in this manner, faceplate 140 provides a rotatable mechanical interface for an AC fixture (e.g., smoke detector) mounted to front surface 110 of adapter plate 100.

Figure 2A:
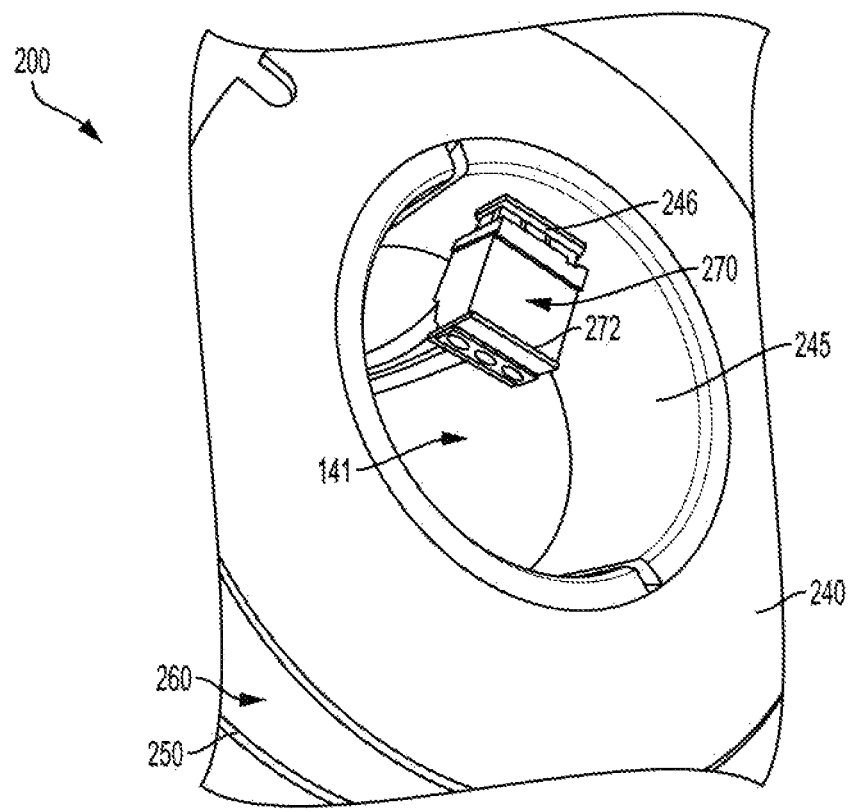
FIG. 2A is a front view of the center housing portion of an embodiment of an adapter plate of the present invention, showing an exemplary attachment of an AC plug.

FIG. 2A is a front view of the center housing portion 200 of an alternative embodiment of an adapter plate of the present invention. The center housing portion 200 comprises a top portion 240 (which, in certain embodiments, may be faceplate 140), base portion 250 (which, in certain embodiments, may be baseplate 150) and central opening 141, defined by the space within interior sidewall 245. An interior housing space 260 is defined between the top portion 240, base portion 250, and interior sidewall 245, and provides space for housing electronic components, such as circuit boards and wiring. In certain embodiments, a faceplate 140 (not shown) may be attached over the top portion 240 of center housing portion 200, with or without interior sidewall 145. The top portion 240 may be rotatable about the central opening 141. In such an embodiment, when the faceplate 140 is connected to the center housing portion (or when the top portion functions as the faceplate), and when side(s) 130 are adjoining to the center housing portion, the faceplate and sides will rotate with the top portion 240, enabling rotation of any accessories or fixtures connected to the faceplate. In an alternative embodiment, the faceplate and side(s) may be independently rotatable when connected to the center housing portion 200. The central opening 141 provides an AC power supply connection port 246 for connection to the AC power supply, depicted here via a wiring harness 270. The wiring harness may have one or more plugs 272 to facilitate AC power to be supplied to a mounted fixture, such as a smoke detector, so that the fixture obtains power directly from the AC power supply rather than from the adaptor plate, which serves merely as a mounting plate for such fixture in such a configuration.

Figure 2B:
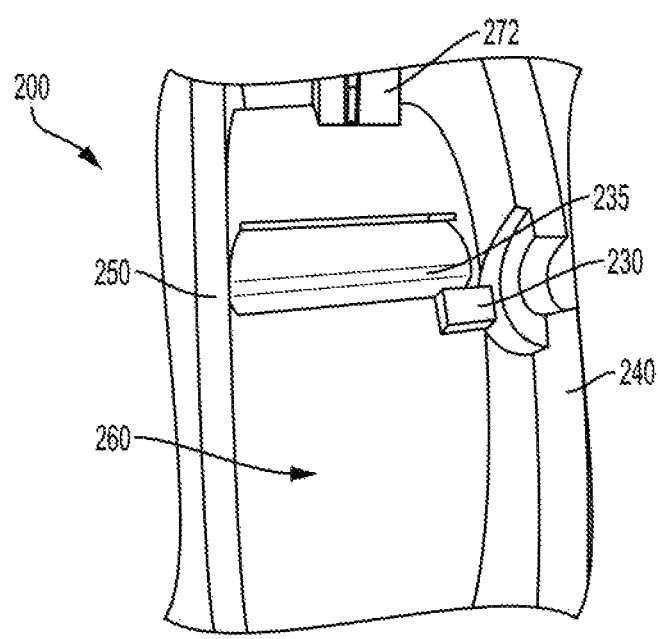
FIG. 2B a side view of the center housing portion of an embodiment of an adapter plate of the present invention, showing a physical stop post for the rotation.
Figure 2C:
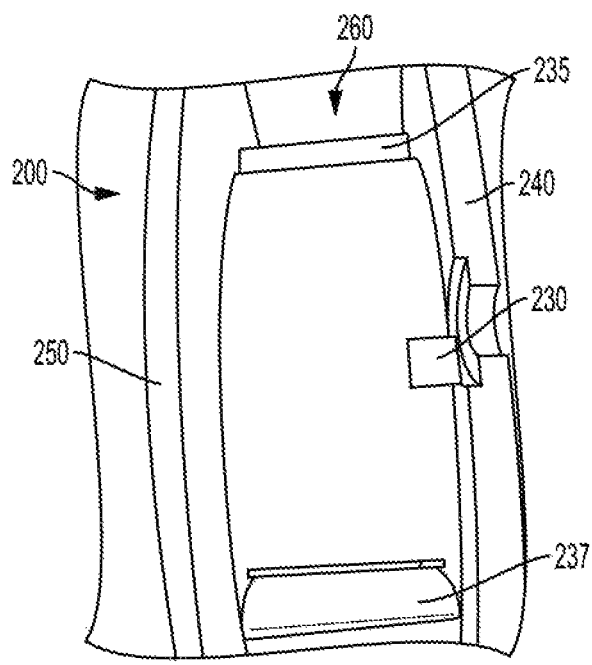
FIG. 2C is a side view of the center housing portion of an embodiment of an adapter plate of the present invention, depicting the adapter plate at the midpoint of its rotation.

FIG. 2B a side view of the center housing portion 200 of an embodiment of an adapter plate of the present invention. In this view, the interior housing space 260 may be seen, which, similar to interior housing 160 as shown in FIGS. 1C and 1D, provides space within which the electronics of the adapter plate are contained. In rotational embodiments of the adapter plate, a stop post 230 may be included and adjoined to the top portion 240 to limit the rotation to a predetermined range. As shown in this embodiment, when the stop post 230 comes into contact with a lip 235 adjoining the interior sidewall 245, the top portion 240 is prevented from further rotation in the direction of the lip 235. FIG. 2C depicts the top portion 240 at approximately the midpoint of its rotation between a first lip 235 and second lip 237.

Figure 3A:
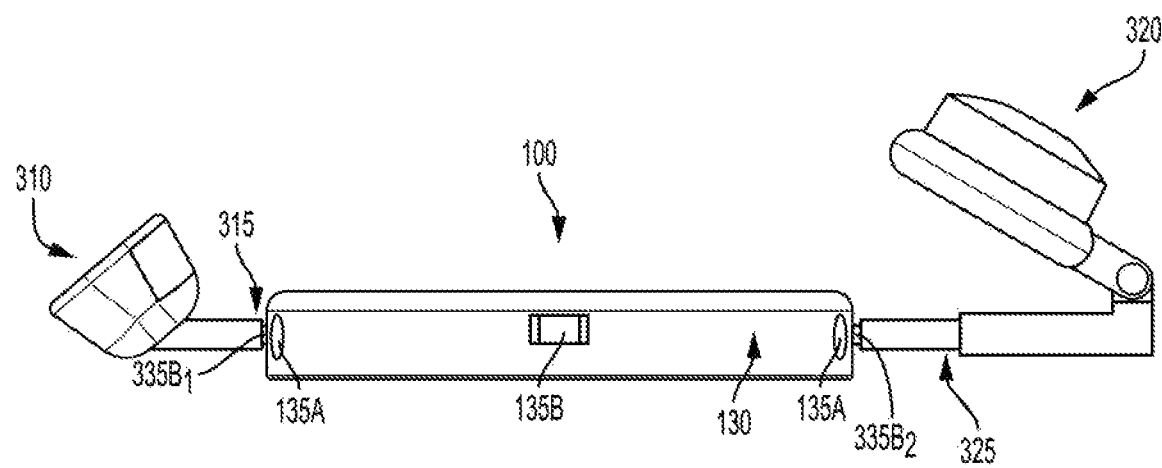
FIG. 3A is a side view of an embodiment of an adapter plate of the present invention, showing exemplary accessory attachments.
Figure 3B:
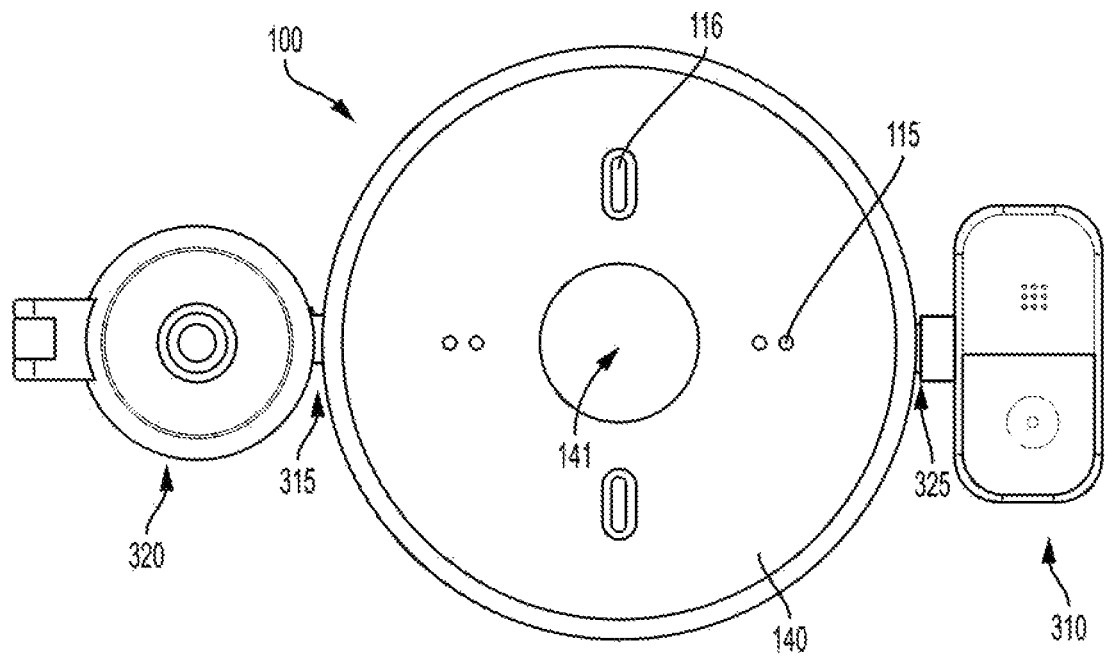
FIG. 3B is a front view of an embodiment of an adapter plate of the present invention, showing exemplary accessory attachments.
Figure 4A:
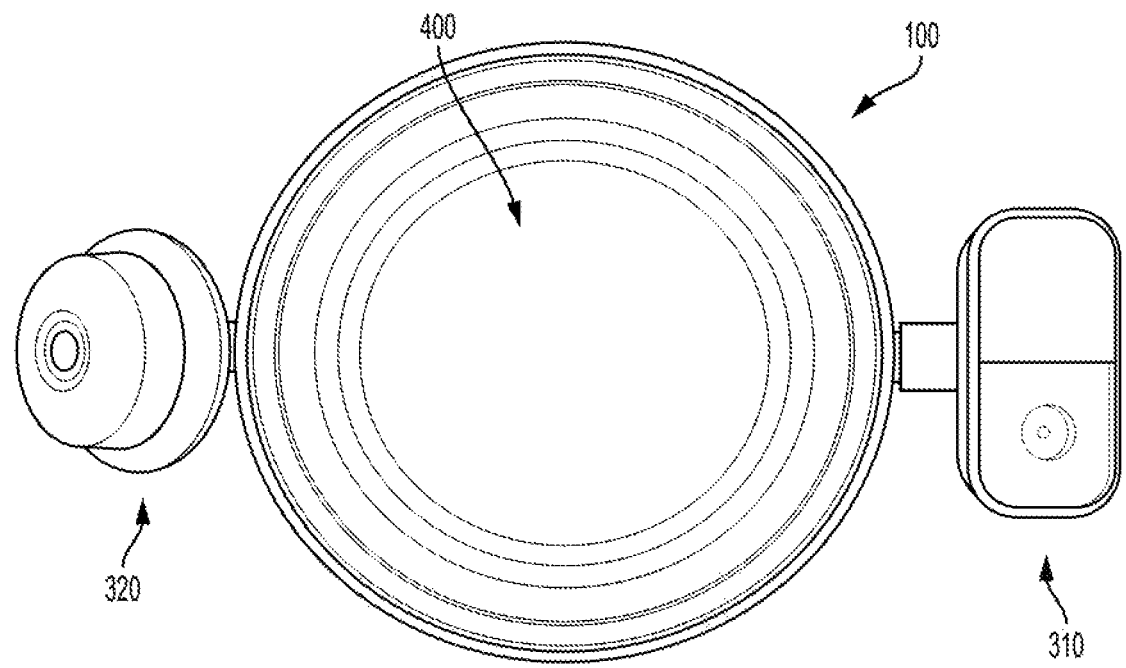
FIG. 4A is a front view of an embodiment of an adapter plate of the present invention, showing exemplary accessory attachments and a household fixture (e.g., smoke detector) mounted on the front of the adapter plate.
Figure 4B:
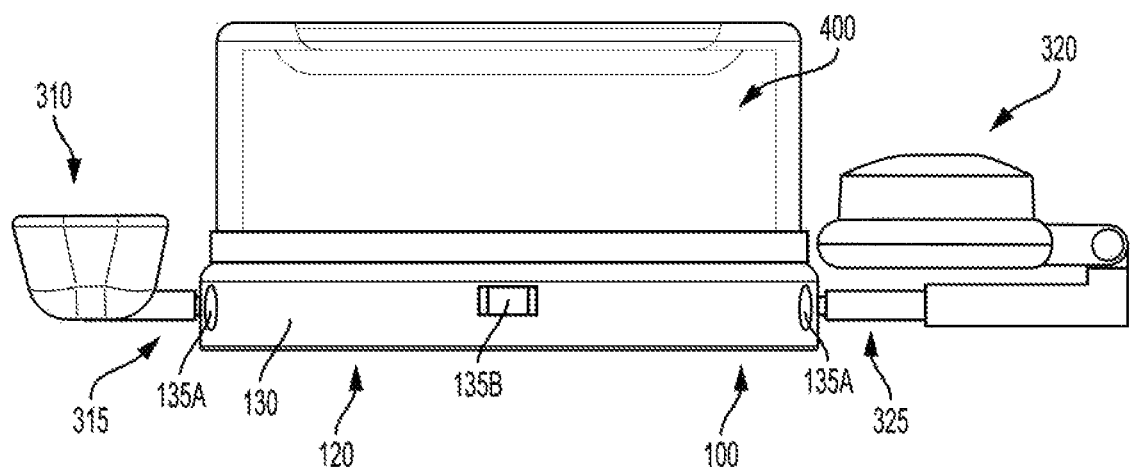
FIG. 4B is a side view of an embodiment of an adapter plate of the present invention, showing exemplary accessory attachments and a household fixture (e.g., smoke detector) mounted on the front of the adapter plate.

FIG. 3A is a side view of an embodiment of an adapter plate 100 of the present invention, showing exemplary accessory attachments. In this embodiment, the adapter plate 100 is shown with two exemplary cameras. A first exemplary camera 310 is connected to the adapter plate 100 via direct USB interface 315 to a first DC power connector port $335B_1$. A second exemplary camera 320 is connected to the adapter plate 100 via a telescoping USB adapter 325 to a second DC power connector port $335B_2$. FIG. 3B is a front view of the exemplary embodiment of FIG. 3A. FIG. 4A is a front view of the exemplary embodiment of FIG. 3A, showing an exemplary household fixture (e.g., smoke detector) 400 mounted on the front surface of the adapter plate. FIG. 4B is a side view of the exemplary embodiment of FIG. 4A. The adapter plate may rotate at least 90 degrees to enable the positioning of the DC power connector ports 135 in an orientation that allows for specific placement of any devices plugged into said ports.

Figure 5A:
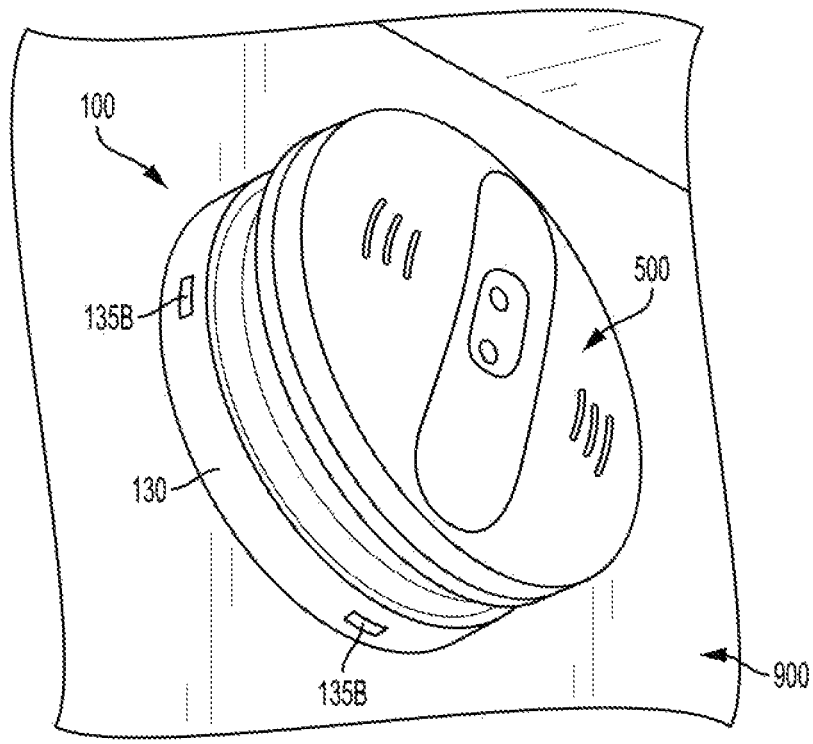
FIG. 5A is a front elevation view of an embodiment of an adapter plate of the present invention, showing a smoke detector mounted on the front of the adapter plate.
Figure 5B:
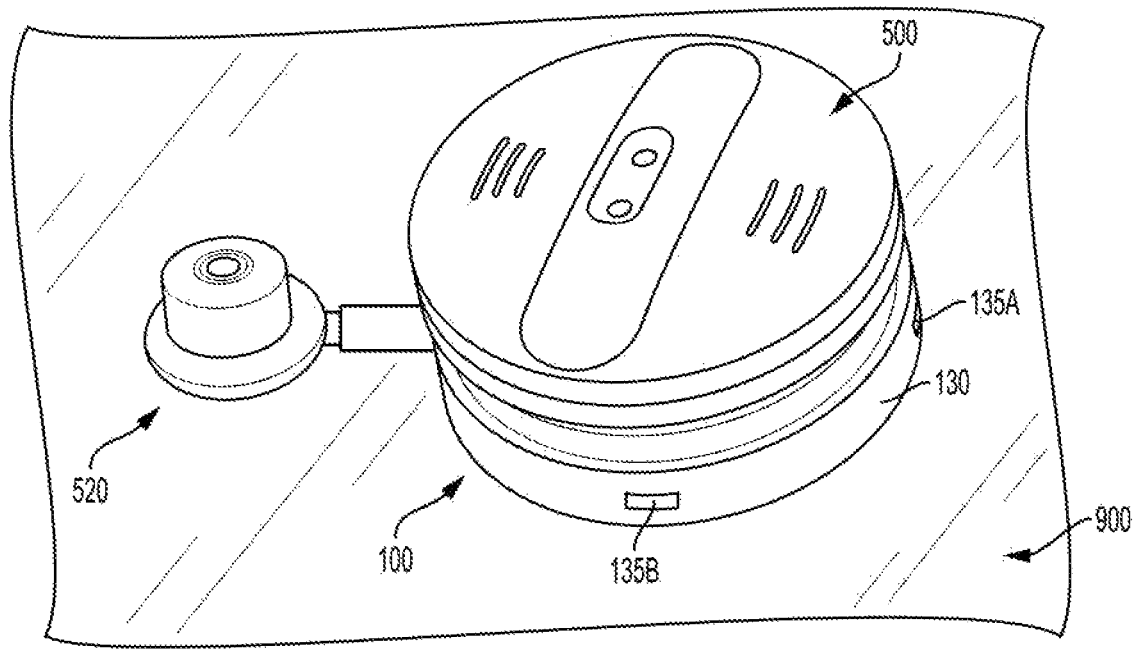
FIG. 5B is a front elevation view of an embodiment of an adapter plate of the present invention, showing a smoke detector mounted on the front of the adapter plate and camera plugged into a port on the adapter plate.

FIG. 5A is a front elevation view of an embodiment of an adapter plate 100 of the present invention, showing a smoke detector 500 mounted on the front surface of the adapter plate. As described above, in such a configuration the smoke detector may be mounted to the adapter plate but not electrically connected to the adapter plate. For example, the AC power supply may be directly connected to the smoke detector, and independently connected to the adapter plate, as shown and described with respect to FIG. 2A. FIG. 5B is an alternative front elevation view of the embodiment of FIG. 5A, showing exemplary 5V USB and 12V DC power connector ports 135A and 135B, as well as an exemplary accessory 520, such as a camera.

Figure 6:
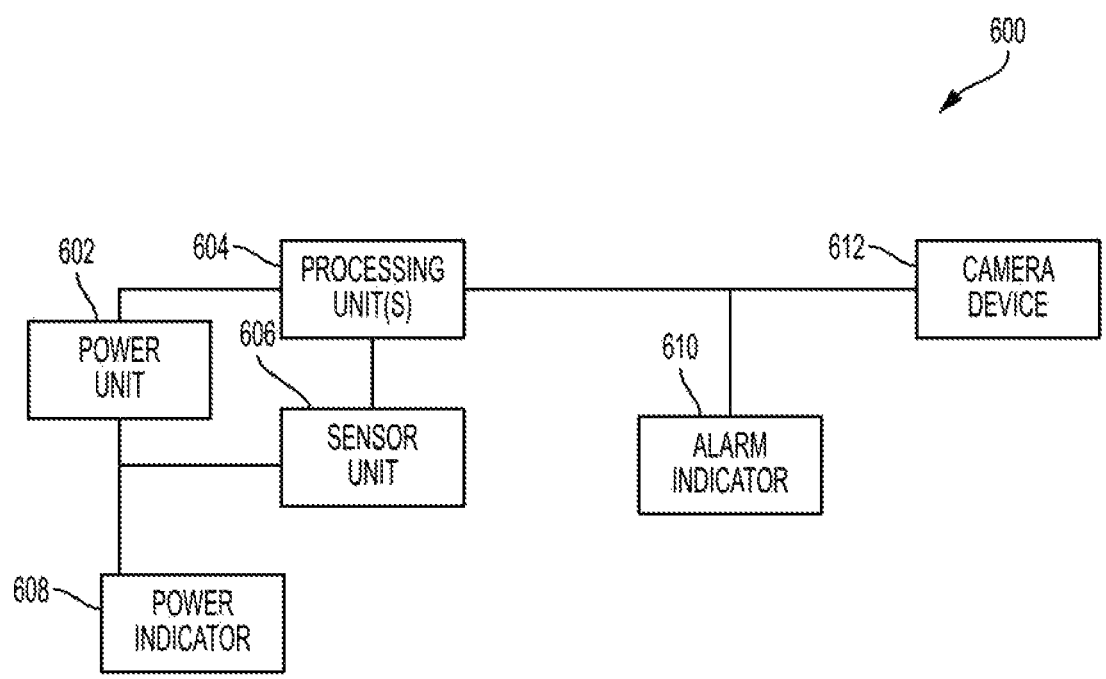
FIG. 6 is a block diagram of a detection device of an embodiment of an adapter plate according to aspects of the present disclosure.

FIG. 6 depicts an exemplary a block diagram of a detection device 600 of an embodiment of an adapter plate 100 according to aspects of the present disclosure. Specifically, processing unit 604 is coupled or otherwise connected to an alarm indicator 610 and a sensor unit 606. When the sensor unit 606 detects a condition, a signal is transmitted to the processing unit 604. In response, the processing unit 604 may activate the alarm indicator 610, which is capable of generating visual and audible indications. The processing unit 604 may also be configured to transmit a wireless or wired signal to another device. In preferred embodiments, the adapter plate will transmit a notification via a wireless local area network or cellular network to a user's computer or cellular phone to alert of a condition detected by the sensor. Additionally, the processing unit 604 may activate a camera device 612 (either automatically or in response to user commands), causing the camera device 612 to capture images of the condition in a particular area.

Figure 7:
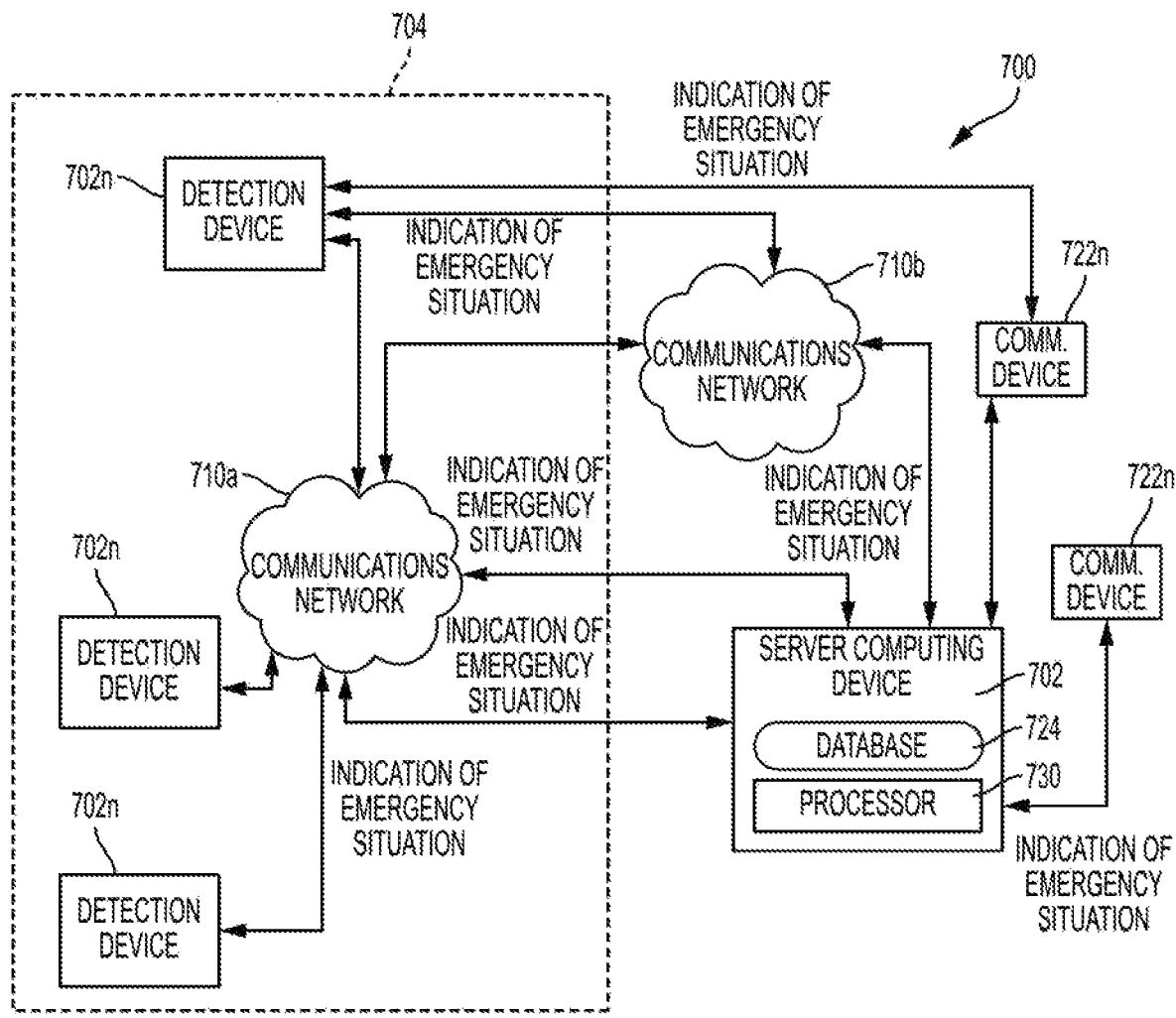
FIG. 7 is an example alarm state detection system utilizing embodiments of an adapter plate according to aspects of the present disclosure.

FIG. 7 depicts an example alarm state detection system 700 utilizing embodiments of an adapter plate 100 according to aspects of the present disclosure. An alarm state detection system 700 that monitors an area for alarm states (e.g., sensing the alarm of a smoke or carbon monoxide detector or a house alarm) includes various computing devices communicating through one or more networks 710a, 710b. The one or more networks may be an IP-based telecommunications network, the Internet, an intranet, a local area network, a wireless local network, a content distribution network, or any other type of communications network, as well as combinations of networks. In the illustrated embodiment, the alarm state detection system 700 includes one or more detection devices or sensors ($702_1$, $702_2$, ..., $702_n$) within one or more adapter plates 100 that are positioned throughout an area 704, which may be a defined space within a facility, structure, building, etc. The detection devices ($702_1$, $702_2$, ..., $702_n$) are capable of detecting a triggered alarm state from an independent alarm device within the same interior space, such as a smoke alarm or intruder alarm. In certain embodiments, the detection of the triggered alarm may be via third wire electrical pickup (i.e., connection to a hard-wired alarm system). In certain embodiments, the detection of the triggered alarm may be via a microphone integral to or connected to the adaptor plate. When emergency situations (e.g., a fire) is detected by an alarm device within the space, the alarm device generates an alarm, which is sensed by the detection device, which transmits a notification to one or more communication devices ($722_1$, $722_2$, ..., $722_n$) located at one or more geographic locations. The communication devices ($722_1$, $722_2$, ..., $722_n$) may be any of, or any combination of, a personal computer; handheld computer; mobile phone; digital assistant; smart phone; server; application; and the like. The communication devices ($722_1$, $722_2$, ..., $722_n$) may also include a communication system to communicate with the various components via a wireline or wireless communications, such as networks 710a, 710b.

The foregoing merely illustrates the principles of the disclosure. Various modifications and alterations to the described embodiments will be apparent to those skilled in the art in view of the teachings herein. It will thus be appreciated that those skilled in the art will be able to devise numerous systems, arrangements and methods which, although not explicitly shown or described herein, embody the principles of the disclosure and are thus within the spirit and scope of the present disclosure. From the above description and drawings, it will be understood by those of ordinary skill in the art that the particular embodiments shown and described are for purposes of illustrations only and are not intended to limit the scope of the present disclosure. References to details of particular embodiments are not intended to limit the scope of the disclosure.

What is claimed is:

1. An adapter plate comprising:
   a baseplate configured to be mounted to a surface, the baseplate having a back surface oriented to face the surface upon which the baseplate is mounted;
   a faceplate rotationally connected to the baseplate, said faceplate having a front surface opposite and substantially in a parallel plane to the plane of the back surface;
   at least one side surface between the front surface and the back surface;
   a central opening in the baseplate;
   an internal housing space existing between the front surface, back surface, and side surface;
   an AC connection accessible within the central opening;
   a DC converter residing within the internal housing; and
   at least one DC power connection port within the side surface configured to receive one or more electronic accessories.

2. The adapter plate of claim 1, wherein the faceplate is configured to enable a detection device to be mounted upon it.

3. The adapter plate of claim 2, wherein the detection device is a smoke detector or carbon monoxide detector.

4. The adapter plate of claim 1, wherein the side surface is connected to the faceplate, such that rotation of the faceplate imparts rotation on the side surface.

5. The adapter plate of claim 4, wherein the faceplate may be rotated between about 90 degrees and about 180 degrees.

6. The adapter plate of claim 1 further comprising a stop post integral with the faceplate, said stop post physically preventing rotation of the faceplate beyond a predetermined range of motion.

7. The adapter plate of claim 1, wherein the at least one DC power connection port provides power in one or more of the following amounts: 5 volts, 12 volts.

8. The adapter plate of claim 1, wherein the at least one DC power connection port is a USB port.

9. The adapter plate of claim 1 further comprising a wiring harness which connects the AC connection of the adapter plate to an AC power source, and wherein the wiring harness is also configured to attach to a fixture mountable on the faceplate of the adapter plate.

10. The adapter plate of claim 1 further comprising a sensor to detect an alarm state from a detection device.

11. The adapter plate of claim 10, wherein the sensor generates an input signal upon detection of an alarm state from a detection device, and further comprising a processing unit that receives said input signal and transmits an alert.

12. The adapter plate of claim 10 further comprising a microphone configured to detect an audible alarm from a detection device, said microphone in electronic communication with the sensor.

13. The adapter plate of claim 10, wherein the adapter plate is wired to an electrical network of one or more detection devices, and wherein the sensor is in electronic communication with said electrical network of one or more detection devices and configured to detect an alarm state thereby.

14. The adapter plate of claim 10 further comprising a light that is activated upon detection of an alarm state.

15. The adapter plate of claim 11, wherein the processing unit further comprises a wireless communication processor configured to transmit an alert to another device.

16. The adapter plate of claim 1 further comprising at least one integrated sensor configured to detect one or more of temperature, humidity, smoke, gas, and light.

17. The adapter plate of claim 1, wherein the at least one DC power connection port is configured to attach and power one or more of a camera, speaker, microphone, motion sensor, light, environmental conditions sensor, or audio device.

18. An adapter plate comprising:
a round baseplate configured to be mounted to a surface, the baseplate having a back surface oriented to face the surface upon which the baseplate is mounted;
a round faceplate rotationally connected to the baseplate, said faceplate having a front surface opposite and substantially in a parallel plane to the plane of the back surface;
a round side surface integral with the faceplate and extending between the front surface and the back surface;
a central opening in the baseplate which permits access to an underlying AC power supply when the baseplate is mounted on the surface surrounding the AC power supply;
an internal housing space existing between the faceplate and the baseplate;
a DC converter residing within the internal housing and configured to be electrically connected to the AC power supply;
at least two DC power connection ports within the side surface configured to receive one or more electronic accessory connections and configured to provide power to said one or more electronic accessory connections;
at least one sensor configured to sense or receive input as to one or more conditions; and
at least one processor configured to perform one or more of the following: transmitting information concerning the status of a sensor and at least one condition; receiving commands from a remote device; transmitting commands to said one or more electronic accessory connections.

19. The adapter plate of claim 18, wherein the at least one processor is configured to perform wireless communication with a local area network or cellular network.

20. An adapter plate comprising:
a baseplate configured to be mounted to a surface, the baseplate having a back surface oriented to face the surface upon which the baseplate is mounted;
a faceplate rotationally connected to the baseplate, said faceplate having a front surface opposite and substantially in a parallel plane to the plane of the back surface;
at least one side surface between the front surface and the back surface;
a central opening in the baseplate;
an internal housing space existing between the front surface, back surface, and side surface;
a self-contained DC power source within the internal housing; and
at least one DC power connection port within the side surface configured to receive one or more electronic accessories.

* * * * *